(12) United States Patent
Chiu et al.

(10) Patent No.: US 7,404,983 B1
(45) Date of Patent: Jul. 29, 2008

(54) METHOD AND APPARATUS FOR OPEN-AIR COATING BY LASER-INDUCED CHEMICAL VAPOR DEPOSITION

(75) Inventors: Wilson K. S. Chiu, Manchester, CT (US); King Hong Kwok, Willimantic, CT (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 91 days.

(21) Appl. No.: 10/910,581

(22) Filed: Aug. 4, 2004

(51) Int. Cl.
  *B05D 5/06* (2006.01)
  *G02B 6/02* (2006.01)
  *C23C 14/30* (2006.01)
  *C23C 16/00* (2006.01)
  *H05B 7/00* (2006.01)
  *B05D 3/12* (2006.01)
  *B05D 5/00* (2006.01)

(52) U.S. Cl. ............... 427/163.2; 427/596; 427/255.12; 427/249.15; 427/249.1; 427/255.5; 427/255.28; 427/184; 427/197

(58) Field of Classification Search ............ 427/255.28, 427/255.5, 249.1, 249.15, 255.12, 596, 163.2, 427/184, 197
See application file for complete search history.

(56) References Cited

U.S. PATENT DOCUMENTS

| | | | | |
|---|---|---|---|---|
| 4,125,644 A | * | 11/1978 | Ketley et al. ................. | 427/498 |
| 4,512,629 A | * | 4/1985 | Hanson et al. ............... | 385/141 |
| 4,579,750 A | * | 4/1986 | Bowen et al. ................ | 427/586 |
| 4,699,800 A | * | 10/1987 | Dustmann et al. ............. | 427/62 |
| 4,727,237 A | * | 2/1988 | Schantz .................. | 219/121.63 |
| 4,790,625 A | * | 12/1988 | Biswas et al. ................ | 385/128 |
| 4,863,576 A | * | 9/1989 | Collins et al. .......... | 204/192.15 |
| 4,957,338 A | * | 9/1990 | Thorncraft et al. ............. | 385/43 |
| 5,223,014 A | * | 6/1993 | Yamauchi et al. ............. | 65/408 |
| 5,320,659 A | * | 6/1994 | Ishiguro et al. ............... | 65/423 |
| 6,278,809 B1 | * | 8/2001 | Johnson et al. ............... | 385/12 |

FOREIGN PATENT DOCUMENTS

JP          62074079 A    *    4/1987

* cited by examiner

*Primary Examiner*—Timothy Meeks
*Assistant Examiner*—Kelly M Stouffer
(74) *Attorney, Agent, or Firm*—James B. Bechtel; Linda M. Deschere; Barry A. Edelberg

(57) ABSTRACT

The present inventions pertain to a method of applying a solid protective coating to articles, to a system capable of depositing a solid film layer on articles, and to hermetically sealed articles. In particular, films are deposited on fused quartz substrates, optical fibers, and other items requiring a hermetic seal by a single or multiple beams laser-induced chemical vapor deposition [LCVD]. According to the present inventions, the protective layer can be deposited on the articles to be hermetically sealed in an open environment at atmospheric pressure and ambient temperature whereby the coating process may occur outside the confines of an enclosure. A coaxial precursor and non-reactive laminar gas jet configuration insulates the deposition area from oxygen and other aerial impurities. Moreover, the present inventions insulate items from corrosion resulting from hydrogen or water penetrating the items' surfaces, maintain the items' mechanical properties, and preserve the integrity of optical signal transmission of optical fibers.

24 Claims, 12 Drawing Sheets

METHOD AND APPARATUS FOR OPEN-AIR COATING BY LASER-INDUCED CHEMICAL VAPOR DEPOSITION

STATEMENT AS TO FEDERALLY SPONSORED RESEARCH

The present inventions were developed pursuant to Grant # N00014-01-1-0691 awarded by the Office of Naval Research. The Government of the United States of America has a paid-up license in this invention and the right in limited circumstances to require the patent application owner to license others on reasonable terms as provided for by terms of the aforementioned Grant.

BACKGROUND OF THE INVENTIONS

1. Field of the Inventions

The present inventions pertain to a method of coating articles; particularly, to a process by which objects are coated with carbon or silicon carbide using laser-induced chemical vapor deposition at atmospheric pressure and ambient temperature. Additionally, the present inventions relate to objects such as optical fibers that are protected from environmental corrosion by an insulating film that is applied in an open-air environment.

2. Description of the Related Art

The process of applying a carbon film to a bare optical fiber in order to hermetically seal the fiber is constantly evolving. Generally, all types of optical fibers share the same basic structure; namely, a core with a high refractive index and a surrounding cladding region with a lower refractive index. In a typical single mode optical fiber, the cladding is approximately 125 μm in diameter, while the core is approximately from 4 to 8 μm in diameter. The core and cladding are indistinguishable to the naked eye and appear as one strand of glass 125 μm in diameter. A carbon coating, which is approximately 50 to 150 nm thick, is deposited onto the cladding. Then, polymer coatings, which are on the order of 10 μm thick, are deposited on top of the carbon coating. Optical fibers are typically forged from a pure glass material, such as fused silica or fused quartz. Then, small impurities and anomalies are introduced into the material in order to obtain the desired refractive indices. The difference between the refractive index of the core and of the surrounding region facilitates the transmission of a signal along the length of the optical fiber. In order to preserve the integrity of transmitted signals and optical fibers' mechanical properties, a protective carbon film is typically applied to the external surface of optical fibers.

The system for applying a coating, film, layer, or sheath can also be used to coat the exposed section of the spliced optical fiber. Optical fiber can only be manufactured in finite lengths. However, there are scenarios such as long distance optical communication lines in which it may become necessary to join multiple fibers in order to produce a fiber longer than can be manufactured as a single strand. Two optical fibers can be joined together by a process called fusion splicing. Fusion splicing is the controlled aligning, melting, and pushing together of optical fibers resulting in a transparent, non-reflective joint. After fusion splicing an optical fiber, a section of the optical fiber is exposed such that the glass core is unprotected from environmental corrosives.

Yamauchi, in U.S. Pat. Nos. 5,223,014 and 5,360,464, discloses a technique for reinforcing and applying a carbon coating to the joint between carbon coated fibers. Yamauchi's process discloses splicing optical fibers in sealed chamber filled with inert gas at a temperature between 700° and 1000° C. using a single laser beam passing through a lens to heat the environment. After the optical fibers have been joined, a reactant hydrocarbon gas is pumped into the chamber so that a reinforcing carbon layer is deposited on the fusion spliced part.

One of the methods by which a carbon sheath is applied to a bare optical fiber is chemical vapor deposition. Chemical vapor deposition is a chain of chemical reactions which transform the gaseous molecules of a precursor gas into a thin film, on the surface of a substrate. Traditionally, the application of a carbon coating to optical fibers by chemical vapor deposition required the use of a furnace and a heated chamber. A precursor gas with carbon as one of its components is pumped into the chamber. Then, an optical fiber is drawn into the chamber. A furnace is used to heat the gas mixture and the optical fiber inside of a chamber to a temperature sufficiently high to result in the decomposition of the precursor gas. Chemical reactions that produce the carbon coating can also result from mounting the reaction chamber on a tower right below the furnace. As the optical fiber is drawn through the reaction chamber, its residual heat from the fiber draw will provide the thermal energy necessary for deposition to occur. Consequently, a carbon film is deposited on the optical fiber's surface.

Moreover, some chemical vapor deposition reactors utilize vacuum chambers. The vacuum chamber can serve three purposes. First, a decrease in the reaction enclosure's pressure results a more uniform coating, but at much lower deposition rates. The deposition rate of a system is measured in terms of either the thickness of the layer deposited on the article to be hermetically sealed divided by the time required to deposit a layer of desired thickness or the desired mass of the solid deposit material divided by the amount of time required to deposit such mass.

Unfortunately, all thickness and mass measurements must be made after completion of the coating process. The thickness of the deposited protective layer or diameter of the deposited layer can be determined by examining a cross-section of a coated optical fiber under an electron microscope with a resolution on the order of 10 nm. Due to the difficulty of obtaining a precise thickness distribution, several thickness measurements are taken across a radial cross-section. Using the average thickness measurement and assuming a constant mass density, 2.21 g cm$^{-3}$ in the case of pure carbon, the total mass of the deposited film may be calculated.

Secondly, by extracting a substantial portion of the air out of the reactor, the risks of the insulating carbon layer containing impurities or not being hermetically sealed are reduced. Thirdly, the carbon film can oxidize or the precursor gas can burn when exposed to the atmosphere at temperatures required for deposition. The minimization of impurities in the carbon film and the reduction of the film's porosity provide increased protection from corrosion of the optical fiber due to contact with hydrogen, water, and other environmental contaminants. However, the utilization of a furnace, a vacuum chamber and vacuum pump, or both makes the application system bulky, inconvenient to relocate, and expensive to operate.

For this reason, some conventional carbon coating applicators use a laser to heat an optical fiber and thermally decompose only the precursor gas that is in the vicinity of the optical fiber. While utilizing a laser as opposed to a furnace reduces the size and weight of the necessary equipment, the optical fiber section to be coated is placed in a vacuum chamber in order to prevent aerial impurities from compromising the integrity and from destroying the protective properties of the carbon film. Moreover, the prior art discloses processes of carbon coating optical fibers which are performed at pressures dramatically below atmospheric pressure due to vacuum extraction.

Alternately, some prior art also discloses pumping an inert gas along with the precursor gas into the reaction chamber after a vacuum pump has extracted the majority of the air from the chamber. However, these conventional systems, which apply a carbon coating to optical fibers using either chemical vapor deposition [CVD] or laser-induced chemical vapor deposition [LCVD] still require at least a reaction chamber and vacuum pump.

Therefore, previous chemical vapor deposition processes have required bulky and expensive reaction chambers in order to control the system's pressure, temperature, and atmospheric composition.

SUMMARY OF THE INVENTIONS

An object of the present inventions is eliminating the necessity of using a closed chamber to regulate pressure, temperature, surrounding gas composition or all three parameters when applying a carbon film to articles.

Another object of the present inventions is to increase the ease of mobility of a carbon coating application system for objects.

Yet another object of the present inventions is to deposit a carbon layer on items by a more cost efficient method.

A further object of the present inventions is to increase the rate at which articles can be coated.

Another object of the present inventions is to facilitate the ease with which a protective layer can be applied to objects.

An additional objective of the disclosed inventions is to insulate items from aerial impurities during the carbon application process by utilizing jets of non-reactive and precursor gases; whereby, a precursor gas jet is peripherally enclosed by a non-reactive gas jet.

A further object of the current inventions is to coat articles with a carbon sheath at atmospheric pressure and at ambient temperature.

Yet another object of present invention is to deposit a carbon layer on optical fiber without inducing signal attenuation to the fiber.

These and additional objects of the inventions are accomplished by an open-air LCVD system for carbon coating objects. The process deposits on an article a protective film which insulates the article from water, oxygen, and other environmental contaminants. The deposition method relies upon a curtain of non-reactive gas peripherally enclosing a precursor gas jet. Through laser heating the surface of the article, the deposition area can be well-defined which is advantageous; particularly, for fusion splicing optical fibers. Since the process can be performed at atmospheric pressure and ambient temperature without the use of a reaction chamber, hermetic sealing can be performed by a system which is mobile, fast, and inexpensive to operate.

BRIEF DESCRIPTION OF THE DRAWINGS

The present inventions can be more completely understood by considering the following Description of the Preferred Embodiments and the accompanying figures. The specification of U.S. Provisional Patent Application No. 60/491,960 filed Aug. 4, 2003 by the instant inventors is a related application and is expressly incorporated herein by reference thereto. The article by the instant inventors entitled *Open-air carbon coatings on fused quartz by laser-induced chemical vapor deposition*, Carbon 41 (2003) pages 673-680, is also expressly incorporated herein by reference thereto. In the figures, like numerals in different figures represent the same structural components or elements. The representations in each figure are diagrammatic and are not depicted to actual scale or precise ratios. The proportional relationships between structural components and elements are approximations.

DESCRIPTION OF THE PREFERRED EMBODIMENTS

Figure 1:
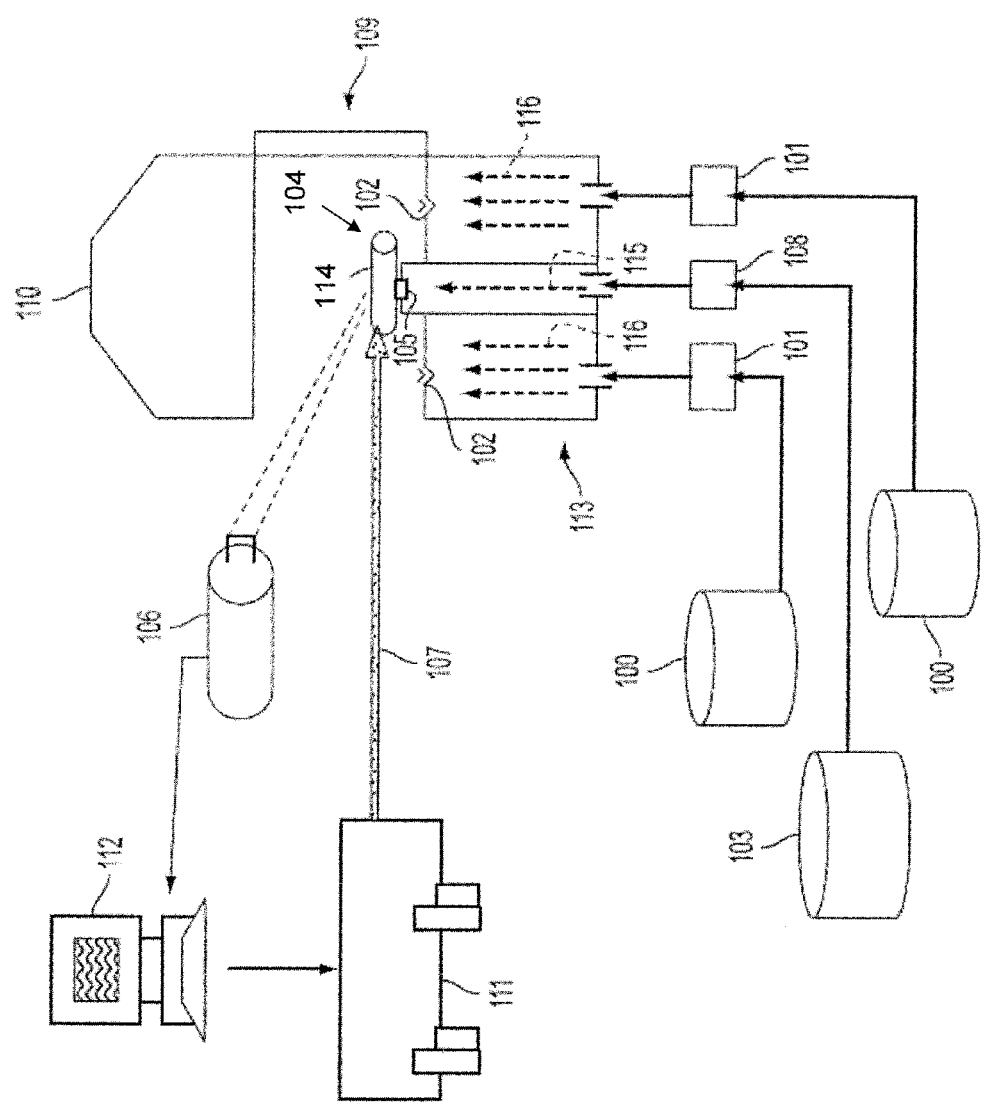
FIG. 1 is a schematic drawing of a system for manufacturing carbon-coated optical fibers in accordance with the present inventions. An internal cross-sectional view of the base is represented.

According to the present inventions, a system for applying a coating, film, layer, or sheath to an item helps to insulate the item from corrosion resulting from exposure to water or hydrogen penetration while simultaneously maintaining the objects' mechanical properties and the signal integrity of optical fibers. By administering a protective layer to an optical fiber, neither the integrity of the transmitted signal nor the fiber's mechanical strength will be compromised.

The application process depends on the use of multiple laminar gas jets arranged in a configuration such that inner gas jets, of which there is at least one, are surrounded by an outer gas jet. The jets of gas pass through a mesh material in order to maintain steady and laminar streams. The aperture size of the mesh material is selected such that the interior jets encircle the article to be coated and the exterior jet provides insulation from aerial contaminants and impurities. A coaxial circle configuration with a single inner gas laminar jet is preferred; however, any configuration in which the inner gas jets are peripherally surrounded by the outer gas jet is acceptable. At least one inner gas jet emits a precursor which pyrolyzes to form the carbon film. In laser-induced chemical vapor deposition, a precursor gas, in the heated region, decomposes into a solid deposit, which affixes to the article to be hermetically sealed, and gaseous molecules by thermally driven chemical reactions. Examples of precursor gases suitable for use in laser-induced chemical vapor deposition include hydrocarbon, halides, carbon tetrachloride gases available from Dow Corning located in Midland, Mich. (trimethylsilane, dimethyldmethane, tetramethylsilane, and tetramethylcyclotetrasiloxane), gases available from Starfire Systems located in Watervliet, N.Y. (hydridopolycarbosilane, SP-4000, SP-2000, methylhydridopolycarbosilane $[SiMe(H)CH_2]_n$, and 1,1,3,3-teramethyl-1,3-disilacyclobutane $[Ch_2SiMe_2]_n$), and other similar gaseous chemicals. An outer gas jet emits a non-reactive gas which insulates the pyrolitic reaction from oxygen and other contaminants found in the air, therefore, eliminating the need for a vacuum chamber. When at a temperature less than or approximately equal to the temperature at a deposition site on the article and atmospheric pressure, a non-reactive gas will not react with the elements and gases present in the precursor jet, article to be coated, and the atmosphere; for example, non-reactive gases such as nitrogen, helium, neon, argon, and other inert gases.

According to the present embodiment, at least one monochromatic coherent light source, such as a laser, is focused on a deposition site, the heated section of an article located within the stream of precursor gas. The monochromatic coherent light source's power level is sufficient to provide enough thermal energy to heat a section of the article such as a stationary or moving optical fiber and the precursor gas in proximity to the article to a sufficiently high temperature to pyrolyze a precursor gas and result in deposition of a hermetically sealing coating. A sufficiently high temperature is the minimum temperature at which the precursor gas will at atmospheric pressure at least partially thermally decompose into hydrogen, carbon, and simpler precursor molecules. The most common hydrocarbon products are methyl radicals $(CH_3)$, ethylene $(C_2H_4)$, and acetylene $(C_2H_2)$. Subsequently, the carbon molecules chemically bond with the surface of the article. Finally, the process may be repeated until the entire surface area of the article is covered by a protective carbon layer which has a thickness substantially between about 30 and 5,000 nm. The range of carbon layer thickness that can be obtained is about 30 to 5000 nm. According to the preferred embodiment, the velocity of the inner hydrocarbon gas jet is in the range of about 1 to 100 cm/s. But the most effective velocity is about 10-30 cm/s. The ratio of the diameter of a non-reactive gas conduit to the diameter of precursor gas conduit is between 8 to 14 for safety and effectiveness reasons. For example, if the inner diameter is 3 mm and the ratio is 10, then the outer diameter is 3*10=30 mm. In the preferred embodiment, the velocity of second conduit is always greater than or equal to half of the inner conduit hydrocarbon jet velocity. The draw rate for the moving article such as an optical fiber should be sufficient to allow uniform coating of the article. The preferred draw rate or velocity range of the linear traverse mechanism (include the V groove) is about 0.01 to 5 cm/s. For glass rod diameters of about 0.1 to 3 mm and laser power up to 25 W focused down to about a one mm laser spot, the system will work most effectively with a linear velocity of the traverse mechanism at the range of about 0.1 to 1 cm/s. According to the preferred embodiment a rack and pinion system provides mechanical motion to the linear traverse mechanism. The linear traverse mechanism must move the article or optical fiber at a linear velocity sufficient to permit uniform coating of the hermetically sealing material without altering the optical properties of the fiber to excess heat from the laser. In the preferred embodiment, the rack and pinion system includes a machined nylon 14½ degree pressure angle spur gear and rack. The pitch of the gear rack and the spur gear must have substantially the same value. The instant inventors used a pitch of 32 in the preferred embodiment of the rack and pinion system. The rack is attached to the side of the linear traverse mechanism and the spur gear is attached to the motor shaft. The spur gear teeth mesh with the teeth on the rack. According to the preferred embodiment, the inner nozzle (conduit) is about 4.2 mm and is made out of 6.4 mm (0.25 in) outer diameter (OD) stainless steel tubing. The outer nozzle diameter is preferably an annulus having a 6.4 mm inner diameter (ID) and 52.3 mm OD. The ID wall of the outer nozzle is defined by the inner nozzle, which is preferably composed of stainless steel (SS) tubing, and the OD of the outer nozzle is preferably made out of aluminum stock. Honeycomb mesh is inserted into the annulus, with pentagon shape and longest spacing of 3.5 mm. The honeycomb mesh is used to fix the location of the inner nozzle relative to the outer nozzle. Gas jet oscillation and turbulence is a fluid mechanics phenomenon that occurs when the jet flows at a high enough velocity into a quiescent medium. Friction between the moving gas and surrounding stationary air will cause the flow to destabilize. This phenomenon can be quantified by the Reynolds number (Re), in which Re is proportional to the velocity and gas jet diameter, and inversely proportional to the gas dynamic viscosity. So, above a critical value of Re, jet oscillation and/or turbulence will occur. To prevent or minimize the effects of oscillation and/or turbulence, one can either reduce the velocity of nozzle flow or reduce the diameter of the nozzle, thereby reducing Re below the critical value. The critical Re is highly specific for different flow configurations. When oscillation occurs, the gas jet will dance from side to side, which is very undesirable since the jet may dance out of the deposition zone. Turbulence also occurs at high gas jet velocity, which will increase the possibility of mixing impurities such as oxygen with the contents exiting the jet. In order to avoid oscillation and turbulence, the inner hydrocarbon gas jet velocity should be kept in range of about 1-100 cm/s for a jet diameter of about 4.2 mm and gas precursors considered.

Therefore, the application process, in accordance with the present embodiments, can be performed in an open-air environment. By eliminating the need for a vacuum chamber or a furnace, the amount of equipment needed is decreased so that the present embodiment is more mobile and cost-efficient methods of carbon coating objects.

The term "open-air" as used herein relates to a carbon or other material coating application system in which an article such as an optical fiber is insulated from contamination caused by oxygen and other impurities in the air by a curtain of non-reactive gas emitted from gas jets rather than by use of a vacuum chamber, furnace, or similar enclosure. Additionally, "open-air" refers to a system operating at atmospheric pressure and ambient temperature.

As illustrated in FIG. 1, the primary components of the open-air carbon coating system are a base 113, a monochromatic coherent light source 111, an exhaust hood 110, a first conduit 105, a second conduit 102, precursor gas supply 103, non-reactive gas supply 100, and a dual-colored pyrometer 106. The base 113 is a rectangular cube manufactured from aluminum or an aluminum alloy.

The interior of base 113 is separated into an inner compartment 115 and an outer compartment 116. The inner compartment 115 extends the entire height of the base 113 such that the outer compartment 116 completely surrounds the inner compartment 115. The inner compartment 115 of the base 113 communicates with a first gas flow regulator 108. The outer compartment 116 of the base 113 communicates with a second gas flow regulator 101. The first gas regulator 108 connects to a supply of precursor gas 103 with stainless steel tubing. The second gas regulator 101 connects to at least one supply of non-reactive gas 100 via stainless steel tubing.

The precursor gas supply 103 and the non-reactive gas supply 100 are pressurized up to approximately 2000 psi. However, a two-stage regulator is used to reduce the pressure to less than approximately 10 psi. The linear velocities at which the precursor gas and the non-reactive gas as they exit through the first conduit 105 and second conduit 102 respectively are controlled using a needle valve. The needle valve for each type of gas is adjusted so that slight pressure upstream of the tubing will force gas through the first conduit 105 and second conduit 102. The precursor gas is pumped into the inner compartment 115 and expelled through a first conduit 105 located in the top surface of the base 113 at a velocity between approximately 1 and 100 cm s$^{-1}$ in which range the precursor gas stream will most effectively operate between 10 and 30 cm s$^{-1}$.

The diameter of the first conduit 105 needs to be larger than the optical fiber 104 in order to fully encompass the optical fiber 104 with the precursor gas during deposition. The non-reactive gas curtain needs to be sufficiently thick to: (1) prevent impurities from entering the deposition zone; (2) prevent oxygen from entering the deposition zone where it can burn the coating 114 and/or ignite the precursor gas; and (3) cool the optical fiber 104 enough as it moves out of the deposition zone so that the coating 114 does not burn. The ratio of the diameter of the first conduit 105 to the diameter of the second conduit 102 will depend on (1) the gas flow rates since unsteady or turbulent flow can entrain oxygen or impurities from outside, the non-reactive gas jet can oscillate to the point that it does not encompass the precursor gas jet, and oxygen and impurities can diffuse through a slow flowing gas stream; and (2) how effective the non-reactive gas is in cooling the moving article such as an optical fiber. However, in order for the system to operate most effectively, the ratio of the diameter of the second conduit 102 expelling the non-reactive gas to the diameter of the first conduit 105 expelling the precursor gas should approximately be between 8 and 14. The precursor gas conduit can have a diameter approximately between 3 and 5 mm. The non-reactive gas conduit can have a diameter substantially between 39 and 65 mm.

The non-reactive gas is pumped into the outer compartment 116 and expelled from the top surface of the base 113 through a second conduit 102 at a velocity substantially equal to at least half of the velocity of the precursor gas. The linear velocities at which the precursor gas and the non-reactive gas exit through the first conduit 105 and second conduit 102, respectively, are each controlled by a needle valve. The needle valve for each type of gas is adjusted so that slight pressure upstream of the tubing will force gas through the first conduit 105 and second conduit 102. Finally, the exhaust hood 110 draws in the non-reactive and remaining precursor gases expelled from the second conduit 102 and the first conduit 105, respectively.

As an optical fiber 104 passes through the system as depicted in FIG. 1, the optical fiber 104 enters the curtain of non-reactive gas created by the expulsion from the second conduit 102. The optical fiber 104 then passes into the stream of precursor gas escaping through the first conduit 105. The optical fiber 104 is insulated from contamination caused by oxygen and other impurities in the air by the curtain of non-reactive gas created by expulsion of the non-reactive gas from the second conduit 102. As the optical fiber 104 passes through the stream of precursor gas being emitted from the first conduit 105, a monochromatic light source 111 produces a beam 107 which is focused on the segment of the optical fiber 104 over which precursor gas is blown. Subsequently, the beam dump 109 absorbs the portion of the beam 107 not intercepted by the optical fiber 104.

Additionally, a dual-color pyrometer 106 measures the temperature of the surface of the optical fiber 104 where the beam 107 strikes the optical fiber 104. The pyrometer 106 transmits the temperature measurement to a computer 112 on which LabVIEW PID Controller software is installed. Ideally, the temperature of the optical fiber 104 within the stream of precursor gas remains within an approximately 10 K range. Thus, if the temperature measured by the pyrometer 106 is outside the acceptable temperature range, the computer 112 alters the power of the monochromatic coherent light source 111.

Figure 2:
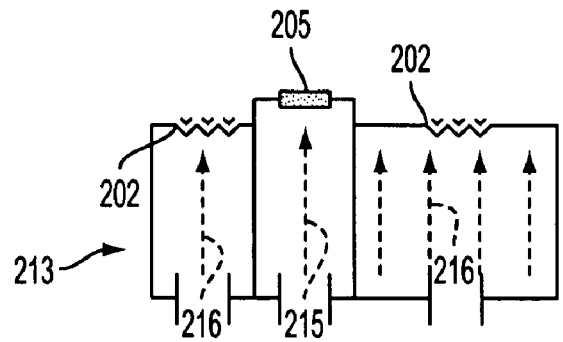
FIG. 2 is a schematic drawing of an alternate embodiment of the present inventions in which the base in the system for manufacturing carbon-coated optical fibers depicted in FIG. 1 is asymmetric.
Figure 3:
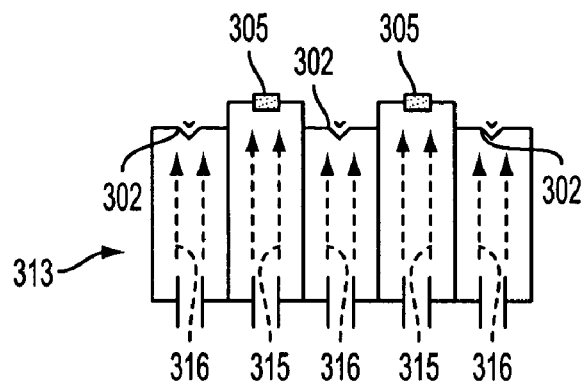
FIG. 3 is a schematic drawing of an alternate embodiment of the present inventions in which the base in the system of apparatus for manufacturing carbon-coated optical fibers depicted in FIG. 1 has multiple compartments for precursor gas.
Figure 4:
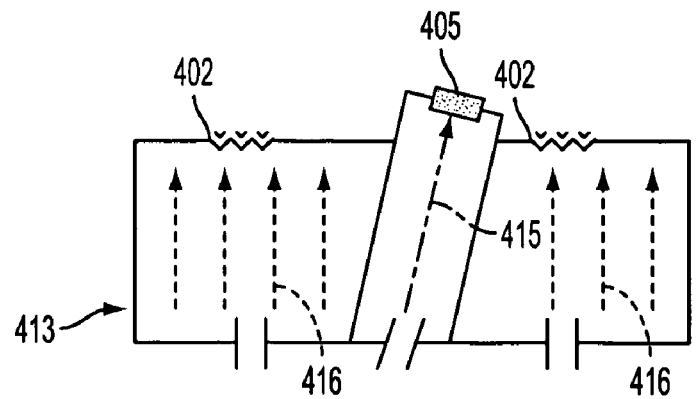
FIG. 4 is a schematic drawing of an alternate embodiment of the present inventions in which the base in the system of apparatus for manufacturing carbon-coated optical fibers depicted in FIG. 1 includes a compartment for precursor gas that is not parallel to the vertical axis.

FIGS. 2-4 illustrate alternate embodiments of the base of the carbon coating system depicted in FIG. 1. Second conduit 202, first conduit 205, and outer compartment 216 are otherwise identical to their FIG. 1 counterparts. FIG. 2 shows a base 213 in which the inner compartment 215 containing precursor is positioned off-center with respect to the base 213 as a whole. FIG. 3 shows a base 313 which has multiple precursor compartments 315. Second conduit 302, first conduit 305, and outer compartment 316 are otherwise identical to their FIG. 1 counterparts. FIG. 4 shows a base 413 in which the precursor compartment 415 is at a non-zero angle to the vertical axis. The angle to the vertical needs to be sufficiently small such that the precursor gas emitted from the inner outlet 405 is completely peripherally enclosed by the non-reactive gas emitted from the outer outlet 402. Outer compartment 416 is otherwise identical to its FIG. 1 counterpart.

Figure 5:
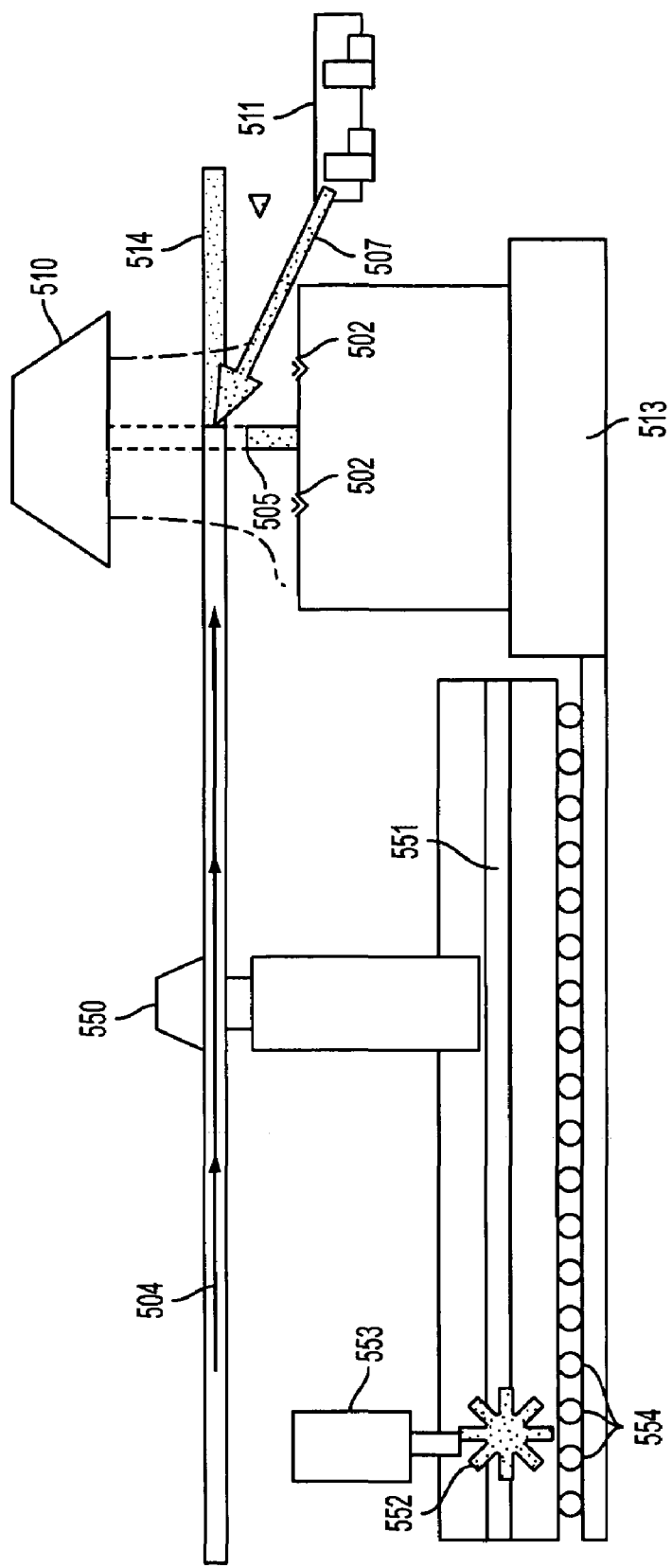
FIG. 5 is a schematic drawing of the test cell assembly depicted in FIG. 1.

FIG. 5 depicts how an optical fiber 504 moves through the carbon coating application system. A V-groove clamp 550 grips the optical fiber 504. The clamp 550 traverse a linear mechanism track 551 by means of a rack and pinion connection 552 rotated by a motor 553 along a series of ball bearings 554. The pitch of the rack and pinion connection 552 and of the track 551 are equal to each other. The linear motion of the clamp 550 moves the optical fiber 504 into the region of non-reactive gas expelled from outer conduit 502 in a base 513 and then into the precursor gas stream emanating from the inner conduit 505 in the base 513. Once a segment of the optical fiber 504 is in the precursor gas jet, a beam 507 from a monochromatic coherent light source 511 is focused on the segment. As the beam 507 heats the surface of the optical fiber 504, the precursor gas thermally decomposes, and carbon then chemically bonds with the optical fiber 504 depositing a carbon film 514 on the optical fiber's 504 external surface. Finally, an exhaust hood 510, which is positioned above and substantially parallel to the top surface of the base 513, draws in the non-reactive and precursor gases expelled from the outer conduit 502 and inner conduit 505 respectively.

Figure 6:
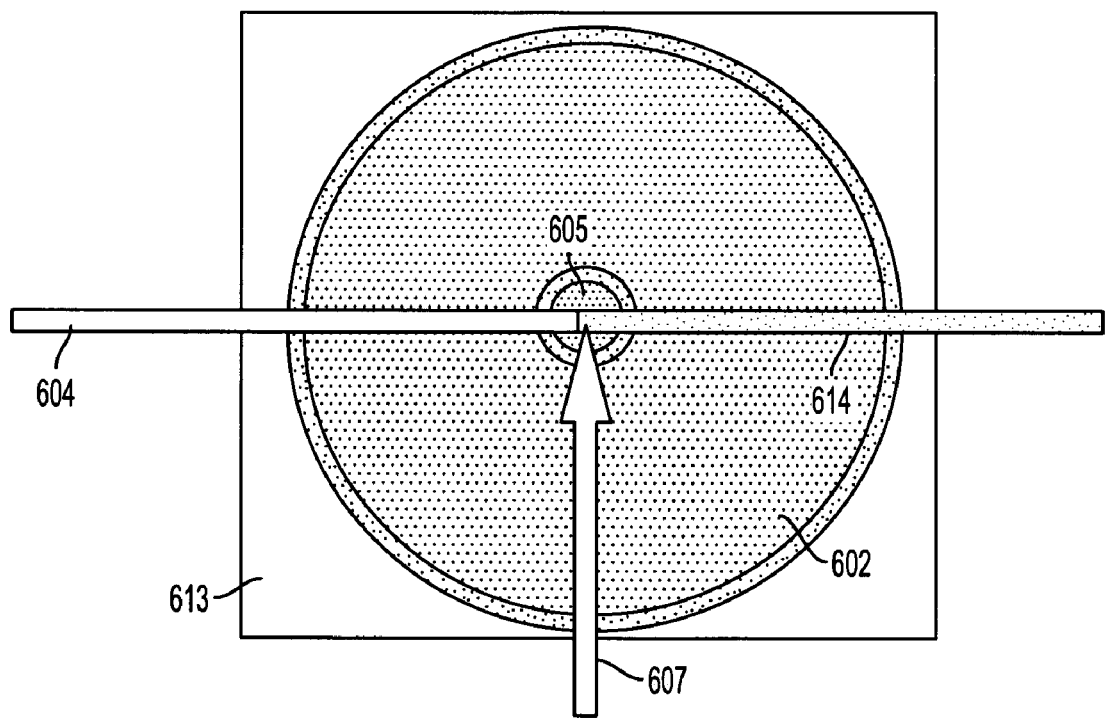
FIG. 6 is a plan view of the surface of the test cell depicted in FIG. 5, through which the jets of non-reactive and precursor gas are expelled.

FIG. 6 depicts a plan view of the top surface of a base 613 as illustrated in FIG. 5. In this embodiment, a non-reactive gas conduit 602 and a precursor gas conduit 605 are in a coaxial configuration. Non-reactive gas is ejected from the entire shaded region 602, which is the non-reactive gas conduit; while, precursor gas is ejected from the complete shaded region 605, which is the precursor gas conduit. A bare optical fiber 604 passes through the curtain of non-reactive gas expelled from the exterior gas conduit 602 and into the precursor gas jet exhausted from the interior gas conduit 605. The segment of the optical fiber 604 within the precursor gas jet is struck by a monochromatic light beam 607 which heats the surface of the optical fiber 604. The coherent monochromatic light beam 607 can also strike upstream of the precursor gas jet, as long as the optical fiber 604 is at a sufficiently high temperature to deposit a carbon coating when exposed to the precursor gas jet. Energy from the beam 607 causes the precursor gas to decompose into smaller molecules. The carbon molecules then chemically bond with the optical fiber 604 thus creating a protective carbon sheath 614 bonded to the exterior of the optical fiber 604.

Figure 7:
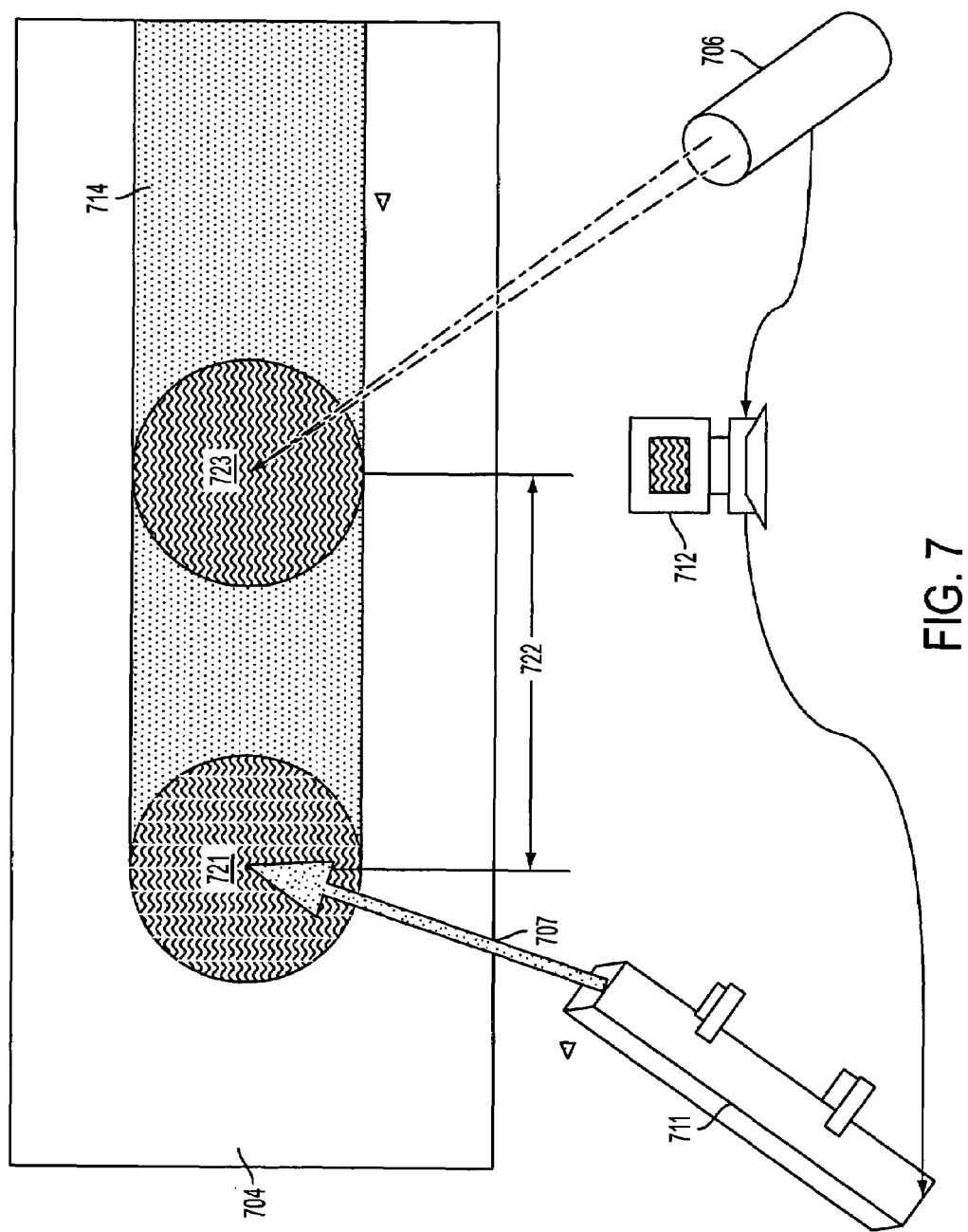
FIG. 7 is a schematic drawing depicting the method by which the temperature at the deposition site is measured and maintained constant within a range of ten degrees Kelvin.

FIG. 7 illustrates a method by which a computer 712, on which LabVIEW PID Controller software is installed, and a dual-color pyrometer 706 measure and adjust the temperature of an optical fiber 704 at a deposition site 721, which is defined by the location where a beam 707 from a monochromatic coherent light source 711 hits the optical fiber 704. The dual-color pyrometer 706 measures the temperature of the surface of the carbon film 714 on the optical fiber 704 at a monitoring site 723, which is defined as the point at which the pyrometer 706 is focused on the optical fiber 704. The offset distance 722 between the deposition site 721 and the monitoring site 723 is on the order of millimeters. The temperature measurement made by the pyrometer 706 is transmitted to the computer 712. If the temperature reading is outside of a specified temperature range of approximately 10 K, the computer 712 communicates with the monochromatic coherent light source 711 and adjusts the power of the monochromatic light source 711 accordingly.

Figure 8:
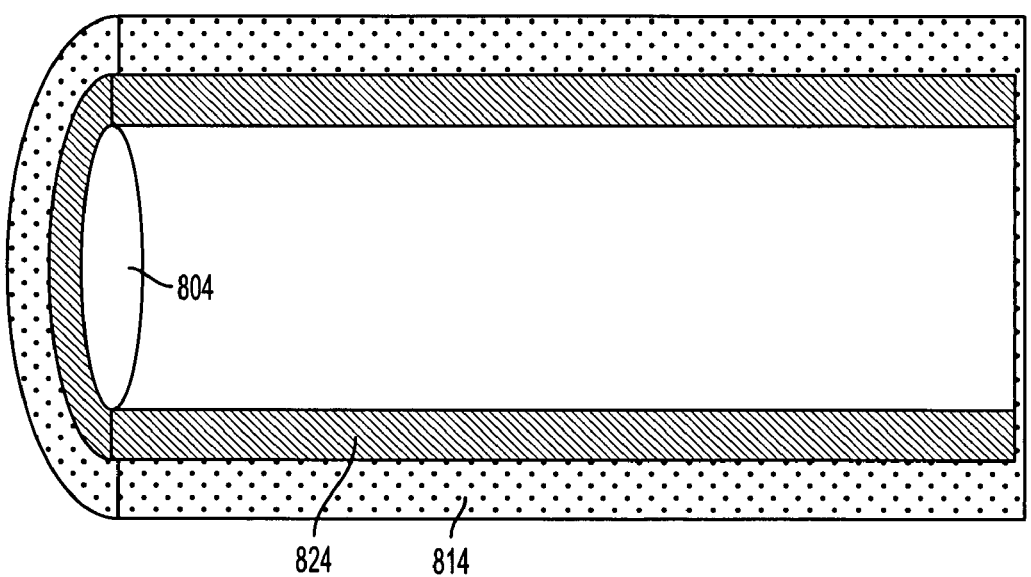
FIG. 8 is a concentric drawing of an optical fiber that has been coated with a carbon film according to the process described by the present inventions. For some cases, an intermediate silicon carbide (SiC) layer was observed.

FIG. 8 is cross-sectional view of a sample optical fiber 804 to which a carbon sheath 814 was applied in accordance with the present embodiment. An intermediate layer 824 between the optical fiber 804 and the protective carbon sheath 814 is formed during the carbon application process. The intermediate layer 824, which bonds the carbon layer 814 to the surface of the optical fiber 804, has a different composition than the core of the optical fiber 804 and the carbon sheath 814.

Figure 9:
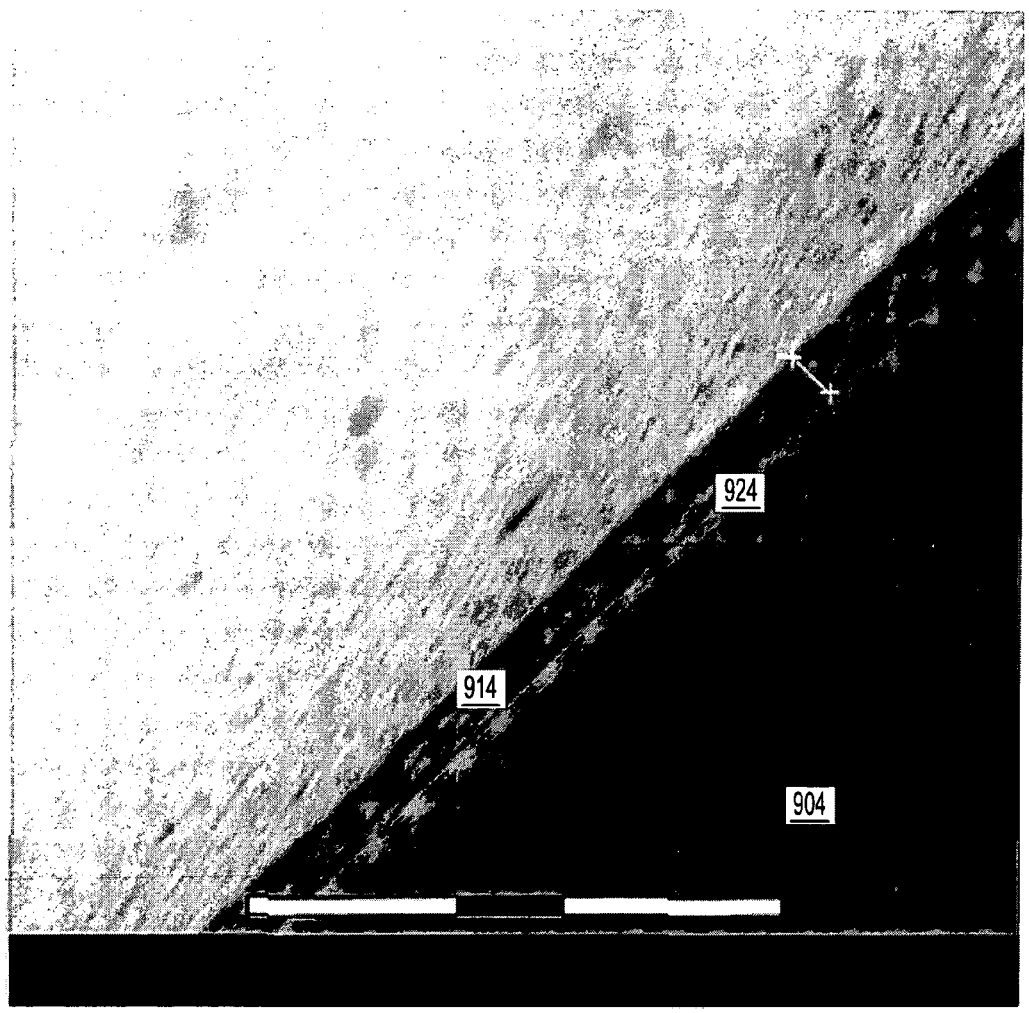
FIG. 9 shows the cross-section of a carbon film deposited on a fused silica optical fiber as viewed using an environmental scanning electron microscope [hereinafter referred to as ESEM].

FIG. 9 is a cross-sectional view of a sample fused silica fiber 904 to which a carbon layer was applied in accordance with the present embodiment. An intermediate layer 924 between the fused quartz substrate 904 and the protective carbon layer 914 is formed during the carbon application process. The intermediate layer 924, which bonds the carbon layer 914 to the surface of the fused silica optical fiber 904, is silica carbide and has a different composition than the core of the fused silica optical fiber 904 and the carbon layer 914. The image was generated by an ESEM.

Figure 10:
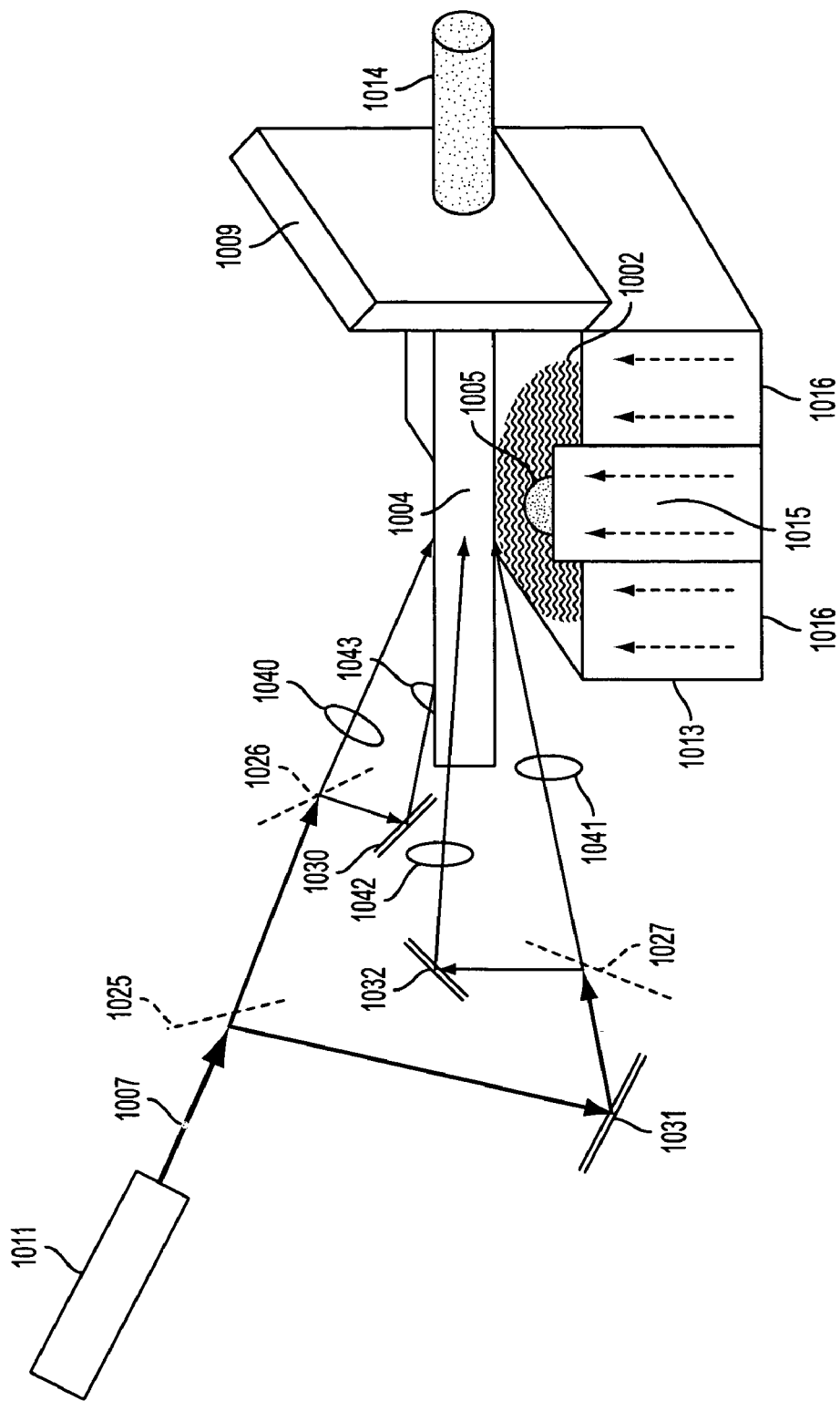
FIGS. 10 and 11 illustrate the method by which the beam from the monochromatic coherent light source passes through multiple beam splitters, mirrors, and focusing lenses in order that beams of substantially equal power are focused approximately equidistant around the periphery of an optical fiber. In this configuration, two, three or four laser beams heating can be use to heat the optical fiber.

FIG. 10 illustrates how the beam 1007 from a monochromatic coherent light source 1011 is split into 4 beams of substantially equivalent intensity and power then focused on the optical fiber 1004. The four resulting beams strike the optical fiber 1004 at points approximately equidistant around the periphery of the optical fiber 1004. A monochromatic coherent light source 1011 emits a beam 1007 which passes through a first 50/50 beam splitter 1025 generating a first and a second beam. The first beam passes through a second 50/50 beam splitter 1026 which splits the beam into a third and a fourth beam with intensities approximately equal to a quarter of the intensity of the original beam 1007. The third beam passes through a first focusing lens 1040 before striking the optical fiber 1004 at an angle to the longitudinal axis of the optical fiber 1004. The fourth beam is directed towards a first mirror 1030 which reflects the fourth beam through a second focusing lens 1043 so that it strikes the surface of the optical fiber 1004 at an angle to its longitudinal axis. The second beam is reflected off of a second mirror 1031 and passes through a third 50/50 beam splitter 1027 creating a fifth and a sixth beam. The fifth beam passes through a third focusing lens 1041 and strikes the optical fiber 1004 at an angle to the longitudinal axis of the optical fiber 1004. The sixth beam is reflected off of a third mirror 1032, passes through a fourth focusing lens 1042, and hits the optical fiber 1004 at an angle to its longitudinal axis.

A base 1013 has central compartment 1015 and an outer compartment 1016 which house a supply of precursor gas and non-reactive gas, respectively. The optical fiber 1004 passes through the stream of non-reactive gas expelled from a second nozzle 1002 and the stream of precursor gas emitted from a first nozzle 1005. The first nozzle 1005 and the second nozzles 1002 connect to the central compartment 1015 and to the outer compartment 1016, respectively. After passing through the gas streams and receiving a carbon layer 1014, the optical fiber 1004 passes through a hole in a beam dump 1009. The beam dump 1009 is oriented such that the excess energy from the third, fourth, fifth, and sixth beams that is not absorbed by the optical fiber 1004 is directed at and absorbed by the beam dump 1009.

Figure 11:
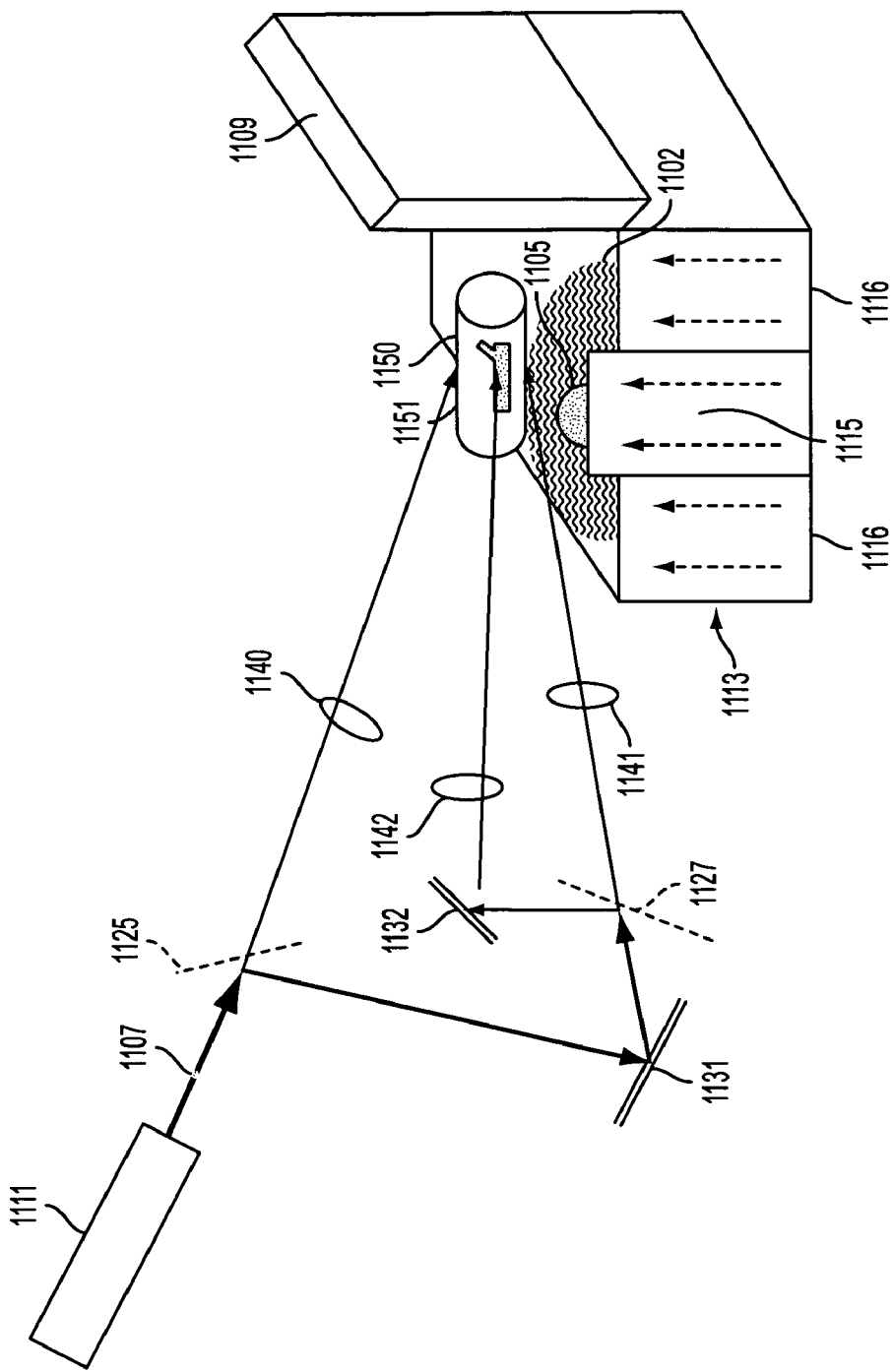

FIG. 11 illustrates how the beam 1107 from a monochromatic coherent light source 1111 is split into 3 beams of substantially equivalent intensity and power then focused on a hollow quartz tube 1150 containing a switch 1151. The three resulting beams strike the quartz tube 1150 at points approximately equidistant around the periphery of the quartz tube 1150. A monochromatic coherent light source 1111 emits a beam 1107 which passes through a 33/67 beam splitter 1125 generating a first and a second beam. The first beam passes through a first focusing lens 1140 before striking the quartz tube 1150 at an angle to the longitudinal axis of the quartz tube 1150. The second beam is reflected off of a first mirror 1131 and passes through a 50/50 beam splitter 1127 creating a third and a fourth beam. The third beam passes through a second focusing lens 1141 and strikes the quartz tube 1150 at an angle to its longitudinal axis. The fourth beam is reflected off of a second mirror 1132, passes through a third focusing lens 1142, and hits the quartz tube 1150 at an angle to its longitudinal axis.

A base 1113 has an inner compartment 1115 and an outer compartment 1116 which house a supply of precursor gas and non-reactive gas, respectively. The quartz tube 1150 is placed inside a stream of precursor gas expelled from a first conduit 1105 which is peripherally surrounded by a stream of non-reactive gas expelled from a second nozzle 1102. The first nozzle 1105 and the second nozzles 1102 connect to the inner compartment 1115 and to the outer compartment 1016 respectively. While in the stream of precursor gas, the quartz tube 1150 receives a carbon sheath. A beam dump 1009 is oriented such that the excess energy from the second, third, and fourth sixth beams that is not absorbed by the quartz tube 1150 is directed at and absorbed by the beam dump 1009.

Figure 12:
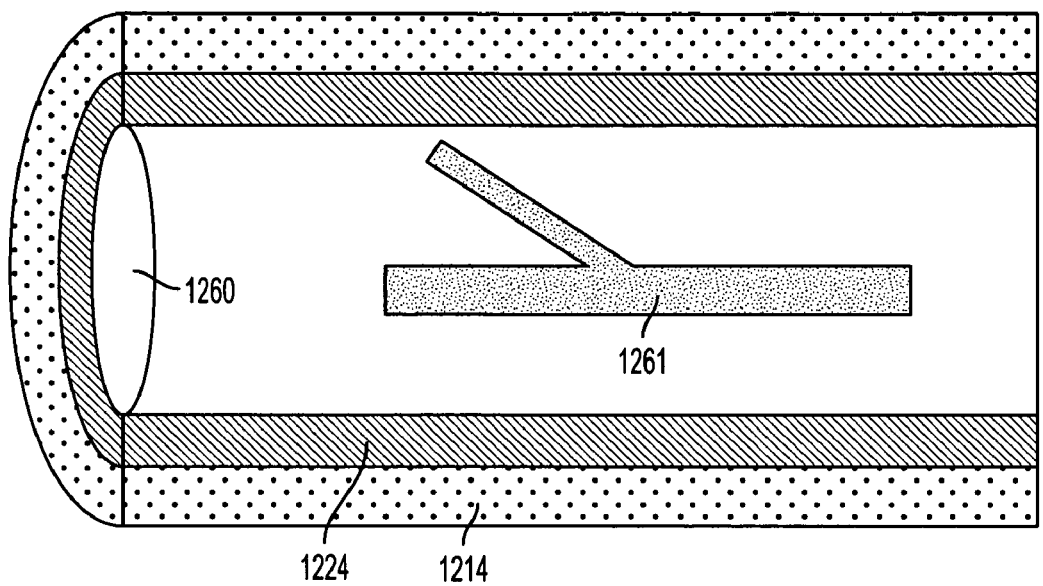
FIG. 12 is a cross-sectional view of a quartz tube which contains an electric switch and has been coated with a carbon layer according to the method described by the present inventions.

FIG. 12 is a cross-sectional view of a sample quartz tube 1260, encasing an electrical switch 1261, to which a carbon sheath 1214 was applied in accordance with the present embodiment. An intermediate layer 1224 between the surface of the quartz tube 1260 and the protective carbon layer 1214 is formed during the carbon application process. The intermediate layer 1224 which bonds the carbon layer 1214 to the exterior of quartz tube 1260, has a different composition than the quartz tube 1260 and the carbon sheath 1214.

Figure 13:
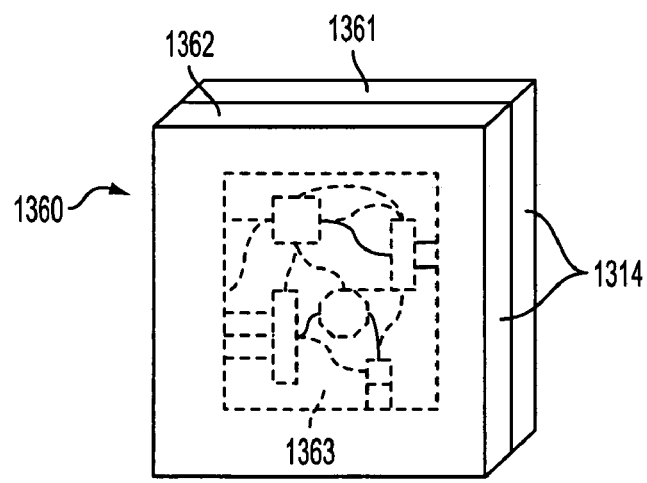
FIG. 13 is a planar view of an electronic microchip hermetically sealed between two silicon wafers by application of a protective carbon film along the seam between the wafers by the process described by the present inventions.

FIG. 13 is planar view of a hermetically sealed electronics microchip 1360. An electronic microchip 1363 sandwiched between a first silicon wafer 1361 and a second silicon wafer 1362. The microchip 1363 is placed on a surface of the first silicon wafer 1361. The second silicon wafer 1362 is placed on top of the electronic chip 1362 and is pressed against the first silicon wafer 1361. A protective carbon film 1314 is then applied along the seam between the first silicon wafer 1361 and the second silicon wafer 1362 in order to prevent corrosion of the electronic chip by oxygen, water, and other environmental impurities.

Figure 14:
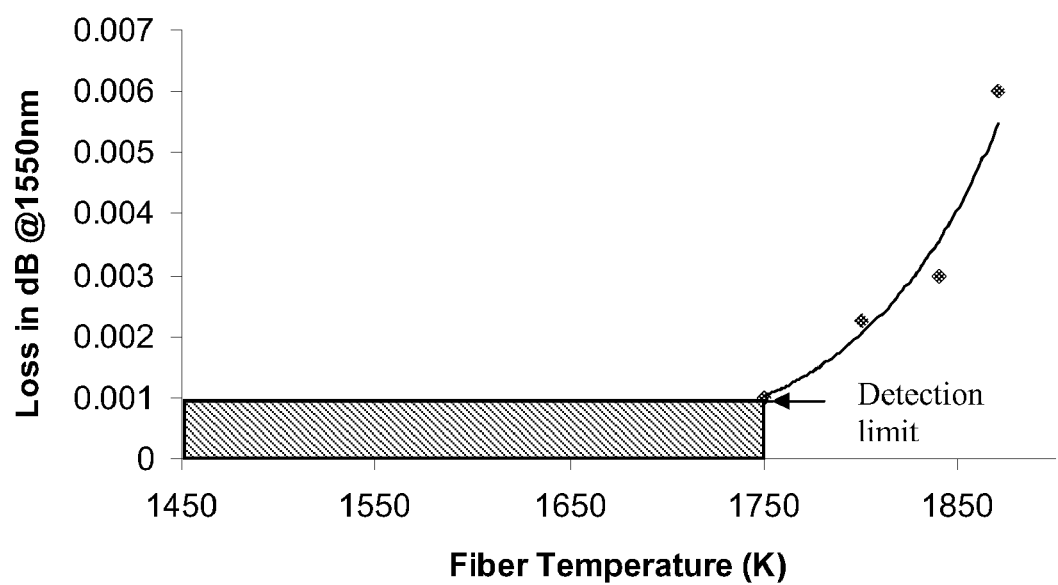
FIG. 14 is a graph of the amount of signal loss in dB (Decibel) in of the optical fiber induced by the LCVD process at different film deposition temperatures. No signal attenuation was observed at the range of desirable deposition temperature.

FIG. 14 shows the amount of optical fiber signal attenuation induced by the laser heating and carbon deposition process. The test results indicated at the deposition temperature range of 1450-1700 K, no signal loss is observed. The attenuation measurements are performed by an EXFO fiber testing system that consists of an IQ 2100 light source operating at 1550 nm and an IQ 2100 power meter with a resolution of 0.001 dB.

Figure 15:
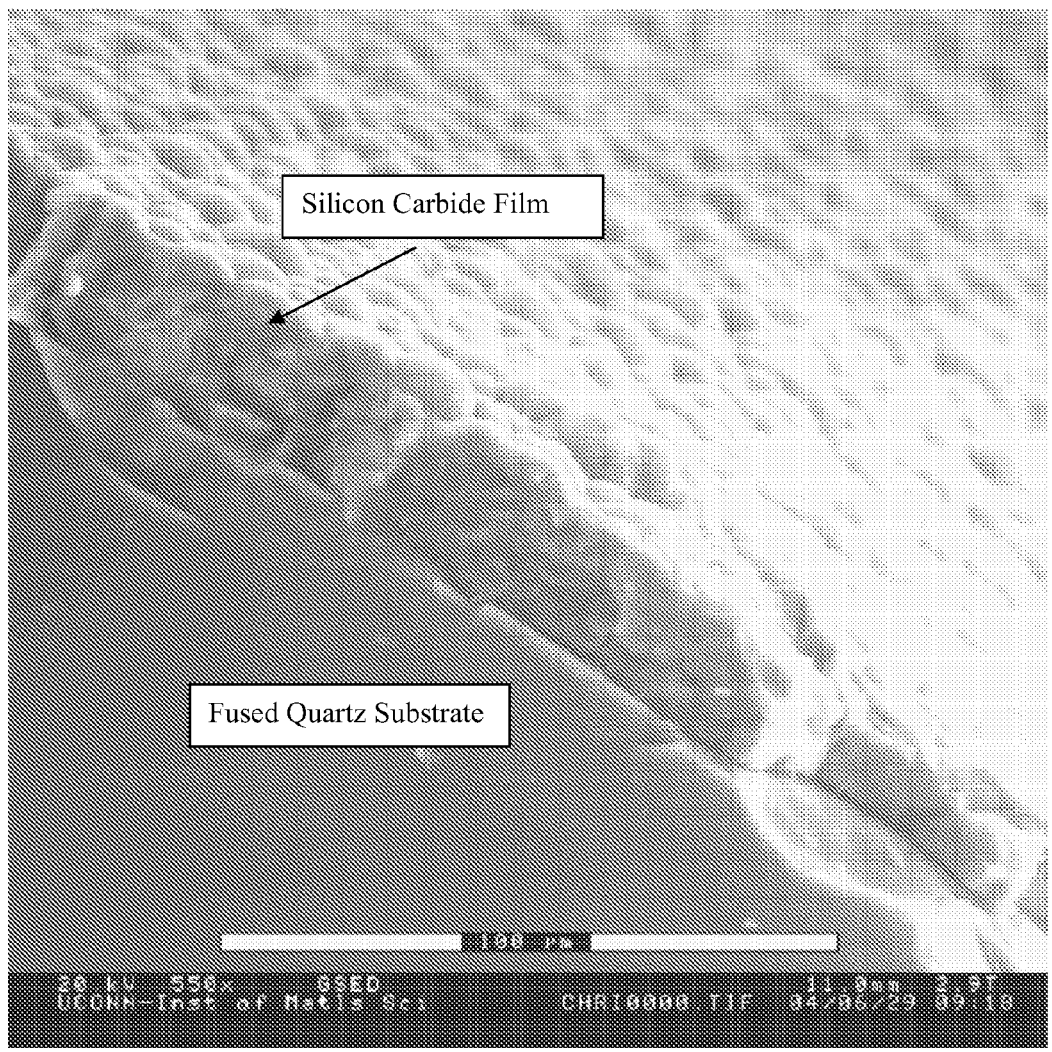
FIG. 15 shows the cross-section of a silica carbide thin film deposited on fused quartz as view by the ESEM.

FIG. 15 is a cross-section view of a sample fused quartz rod [###] to which a silica carbide layer [###] was applied in accordance with the present embodiment. The image was generated by an ESEM.

EXAMPLES

Example 1

A bare fused silica optical fiber 104 with a diameter of 3 mm was cleansed with methanol and distilled water before the carbon coating process was started. A protective carbon coating 514 was applied to a bare silica quartz optical fiber 104 by the process as illustrated in FIGS. 1 & 5. The applied carbon layer was polycrystalline graphite with a grain size less than or equal to 100 angstroms. Additionally, the carbon film 514 had a thickness of 250 nm and an assumed constant mass density of 2.210 g cm$^{-3}$.

The uncoated optical fiber 104 was secured in the v-groove clamp 550 which was mounted on a linear traverse mechanism attached to a gear rack 551 as illustrated in FIG. 5. The v-groove clamp 550 was driven across the linear traverse mechanism using a rack and pinion system. The rack and pinion system comprised the gear rack 551, a machined nylon 14½ degree pressure angle spur gear 552, and an electric motor. The spur gear 552 attached to the shaft of the electric motor 553 which rotated the spur gear 552. The teeth of the spur gear 552 meshed with a plurality of ball bearings 554 housed in the gear rack 551. The pitch of the gear rack 551 and of the spur gear 552 are each equal to 32. The V-groove clamp 550 moved linearly at a speed of between approximately 0.01 to 5 cm s$^{-1}$. However, for a fused silica optical fiber 104 with a diameter of 125 µm and fused quartz rod with a diameter between approximately 1 and 3 mm and a laser 111 operating at up to 25 Watts, the deposition process will work most effectively when the v-groove clamp 550 moves a linear speed substantially between 0.1 and 1 cm s$^{-1}$.

The top surface of the base 113, which was manufactured from aluminum or an aluminum alloy, had a first conduit 105 and a second conduit 102 with diameters of 4.2 and 52.3 mm respectively. The first conduit 105 was formed by stainless steel tubing having an outer diameter of 6.4 mm. The inner wall of the second conduit 102 was formed by the stainless steel tubing of the first conduit 105; while, the outer wall of the second conduit 102 was manufactured from aluminum. A honey comb mesh material, having pentagon-shaped apertures which were 3.5 mm wide at their widest point, was inserted perpendicular to and between the stainless steel tubing of the first conduit 105 and the aluminum outer wall of the second conduit 102. Therefore, the nitrogen gas was expelled from a surface of the base 113 through the honeycomb mesh in the second conduit 102. The honeycomb mesh helped to prevent the nitrogen gas stream emanating from the second conduit 102 from becoming unsteady, turbulent, or oscillating, which might permit oxygen and other aerial impurities to reach the segment of the optical fiber 104 inside the hydrocarbon gas stream.

A first manually adjustable gas flow regulator 108 controlled the rate at which propane gas flowed from the propane supply 103 into an inner compartment 115 in the base 113. The gas flow regulator 108 was adjusted such that the first conduit 105 expelled propane gas with 99.95% purity at a linear velocity of 17 cm s$^{-1}$. A second manually adjustable gas flow regulator 101 controlled the rate at which nitrogen gas flowed from the nitrogen gas supply 100 into an outer compartment 116 in the base 113 so that nitrogen gas with a linear velocity of 8 cm s$^{-1}$ was expelled through the second conduit 102.

The fused silica optical fiber 104 moved into the region defined by the jet of propane gas expelled from the first conduit 105. The beam 107 from a 25-Watt continuous wave carbon dioxide laser (Synrad J48-2W) 111 operating at a wavelength of 10.6 µm passed through a series of three 50/50 beam splitters 1025, 1026, and 1027 creating four beams. Each of the resulting four laser beams passed through a ZnSe focusing lens 1040, 1041, 1042, and 1043 in order to produce four beams of substantially equivalent power (intensity/surface area) that were distributed substantially equidistant around the periphery of the optical fiber 104. The diameter of the beams hitting the optical fiber 104 is approximately 1 mm. The laser beams after passing through the beam splitters and reflecting off of mirrors 1030, 1031, and 1032 with a highly reflective Copper coating were focused at an angle with respect to the axis of the fused silica optical fiber 104 and on the portion of the fused silica optical fiber 104 inside the stream of propane gas. The four laser beams heated the deposition areas 721 on the optical fiber 104. The profile of the initial laser beam 107 was Gaussian TEM$_{00}$ with a beam diameter of 1.8 mm, a divergence angle of 4 mRad, and M$^2$=1.3.

The fused silica fiber 104 absorbed the laser energy to produce a heated deposition site 721 while propane gas pyrolyzed near the fiber's 104 surface creating a thin carbon coating 514. Using a negative feedback loop, a two-color pyrometer (Quantum Logics QL2500-1A/S7) 106, which operated at wavelengths of 0.90 and 1.55 µm, measured the temperature of the optical fiber 104 at a monitoring site 723, which is approximately 2.4 mm from the deposition site 721. The pyrometer 106 was calibrated for use within the temperature range of 1073 to 1773 K with an Optronic Laboratories' quartz-halogen tungsten calibration lamp with a calibration accuracy of ±25 K. If the measured temperature was not within ±10 K of the initial preset temperature, which ranged from 1375 to 1750 K, the pyrometer 106 communicated with the computer 112 on which the LabVIEW PID Controller software was installed. When deviations greater than 5 K were measured, the computer 112 altered the laser power output in order to bring the temperature at the deposition site 721 back into the range of tolerance.

The beam dump 109 located behind the optical fiber 104 and opposite to the carbon dioxide laser 111 was a metal plate forged from 2024 aluminum, painted black, and measured 12.7 cm×15.24 cm×1.905 cm. The metal plate 109 had one straight internal channel 0.635 cm in diameter through which water is circulated using a water pump. The metal plate 109 was oriented with respect to the rest of the assembly so that any part of the laser beam 107 not being intercepted by the optical fiber 104 impinges on the water channel within aluminum plate 109.

Fused quartz substrates were invisible to the pyrometer 106.

Example 2

The carbon layer application in a second preferred embodiment is carried out in the same way as that in the first preferred embodiment, except in the following aspects. The beam 107 from the 25-W continuous monochromatic laser 111 is split into three beams instead of four as depicted in FIG. 11. The hydrocarbon gas blown onto the heated deposition site 721 is butane with the same purity as the propane used in the first preferred embodiment. The initial preset temperature at the deposition site is between 1375 and 1500 K. The inner compartment 115 of the base 113 is not centered within the base 113. While not centered in the base 113, the inner compartment 113 is still axially surrounded by the outer compartment 116.

Example 3

A hermetically sealing silicon carbide layer 514 is applied to a microchip assembly 1360 comprising a superconductor microchip 1363 pressed between a first silicon wafer 1361 and a second silicon wafer 1362, by the process as illustrated in FIGS. 1 and 10. The top surface of the base 113 has a central nozzle 105 and an outer nozzle 102 with diameters of 4.2 and 52.3 mm respectively. The outer nozzle 102 expels argon gas, and the central nozzle 105 expels trimethylsilane.

The microchip assembly 1360 is secured on the top surface of the base 1013 within the stream of trimethylsilane gas emanating from the central nozzle 1005. The microchip assembly 1360 is oriented such that the microchip 1363 is perpendicular to the surface of the base 113 containing the central nozzle 105 and the outer nozzle 102. A 25 Watt continuous carbon dioxide laser 111 operating at a wavelength of 10.6 μm is focused on the seam between the first silicon wafer 1361 and the second silicon wafer 1362 and heats the deposition area along the seam. The microchip assembly 1360 absorbs the energy from the argon ion 111 to produce a heated deposition site. The thermal energy of laser 111 causes the trimethylsilane gas in the vicinity of the surface of the microchip assembly 1360 to thermally decompose thus depositing a thin silicon carbide coating 514 along the seam of the microchip assembly 1360.

Using a negative feedback loop, a two-color pyrometer 106 and a computer 112, on which LabView PID Controller software is installed, maintain the temperature of the surface of the microchip assembly 1360 at the deposition site within ±10 K of the initial temperature. The pyrometer 106 is calibrated for use within the temperature range of 1073 to 1773 K with an Optronic Laboratories' quartz-halogen tungsten calibration lamp with a calibration accuracy of ±25 K. When the temperature deviates more than 10 K, the pyrometer 106 communicates with the computer 112 which in turn alters the laser's 111 power output in order for the temperature to return to within the acceptable range.

The beam dump 109, which is located behind and parallel to the microchip assembly 1360 and opposite the carbon dioxide laser 111, is a solid metal slab. The metal slab 109 is oriented with respect to the rest of the assembly such that the metal slab 109 absorbs any part of the laser beam 107 not being intercepted by the microchip assembly 1360.

Example 4

The carbon layer application in a second preferred embodiment is carried out in the same way as that in the first preferred embodiment, except in the following aspects. The base 113 has multiple inner compartments 115. However, all of the inner compartments 115 are surrounded by the outer compartment 116. All of the streams of hydrocarbon gas emanating from the first conduits 105 are peripherally surrounded by the stream of non-reactive gas emanating from the second conduit 102 between the surface in the base 113 in which the first conduits 105 and the second conduit 102 are located and the exhaust hood 110.

Example 5

A hermetically sealing silicon carbide layer 514 is applied to a quartz tube 1150 encasing an electrical switch 1151 by the process as illustrated in FIGS. 1 and 11. The top surface of the base 113 has a central nozzle 105 and an outer nozzle 102 with diameters of 4.2 and 52.3 mm respectively. The outer nozzle 102 expels argon gas with a linear velocity of 8 cm s$^{-1}$. The central nozzle 105 expels trimethylsilane at a linear velocity of 17 cm s$^{-1}$.

The quartz tube 1150 is placed on the top surface of the base 1113 within the central nozzle 1105. A 25 W continuous carbon dioxide laser 111 operating at a wavelength of 10.6 μm is focused on the portion of the surface of the quartz tube 1150 inside the stream of trimethylsilane gas and heats the deposition area on the tube 1150. The quartz tube 1150 absorbs the energy from the laser 111 to produce a heated deposition site 721. The laser's 111 thermal energy causes the trimethylsilane gas in the vicinity of the surface of the quartz tube 1150 to break down creating a thin silicon carbide coating 514.

Using a negative feedback loop, a two-color pyrometer 106 and a computer 112, on which LabView PID Controller software is installed, maintain the temperature of the quartz tube 1150 at the deposition site 721 within ±10 K of the initial temperature. The pyrometer 106 is calibrated for use within the temperature range of 1073 to 1773 K with an Optronic Laboratories' quartz-halogen tungsten calibration lamp with a calibration accuracy of ±25 K. When the temperature deviates more than 5 K, the pyrometer 106 communicates with the computer 112 which in turn alters the laser's 111 power output in order for the temperature to return to within the acceptable range.

The beam dump 109, which is located behind the quartz tube 1150 and opposite the laser 111, is a solid metal slab. The metal slab 109 is oriented with respect to the rest of the assembly such that the metal slab 109 absorbs any part of the laser beam 107 not being intercepted by the quartz tube 1150.

The preceding examples are not intended to limit the breadth of the present inventions disclosed in this application. Additional embodiments are disclosed in the following claims. Individuals skilled in the art will appreciate and recognize that a variety of alternative methods and embodiments exist given the above teachings. Therefore, the present inventions may be practiced, consistent with the scope of the claims, in manners other than those means explicitly described.

What is claimed is:

1. A method of hermetically sealing articles by applying a coating comprising the steps of:
    providing an article to be hermetically sealed with a coating;
    expelling a stream of precursor gas, at ambient temperature, from a first conduit in a surface of a base thereby creating a first curtain of precursor gas;
    expelling a stream of non-reactive gas, at ambient temperature, from a second conduit in said surface of said base, whereby said stream of non-reactive gas at ambient temperature forms a second curtain of non-reactive gas that peripherally surrounds said first curtain of precursor gas at ambient temperature, said first conduit and second conduit having diameters such that the ratio of the diameter of said second conduit to said first conduit is between 8 and 14;
    moving said article relative to said first and second curtains so that said article passes through said second curtain, enters said first curtain at an entry point, passes through said first curtain, exits said first curtain at an exit point, and then passes through said second curtain, so that said first curtain at ambient temperature, which is peripherally surrounded by said second curtain at ambient temperature impinges against a segment of said article moving therethrough;
    laser heating said segment of said article moving through said first curtain, thereby heating and pyrolyzing a portion of said precursor gas in proximity to said segment of said article; and
    applying a solid coating formed from said pyrolyzed precursor gas onto said segment of said article, so as to form a coated section of said article that moves into and through said second curtain, said second curtain contacting and sufficiently cooling said coated section of said article cooling to prevent said coating thereon from burning upon exposure to air;
    each of said steps being performed in an open-air environment.

2. The method of hermetically sealing articles of claim 1 wherein said solid coating is comprised substantially of carbon.

3. The method of hermetically sealing articles of claim 1 wherein said solid coating is comprised substantially of silicon carbide.

4. The method of hermetically sealing articles of claim 1 wherein said article includes a microchip sandwiched between at least two silicon wafers.

5. The method of hermetically sealing articles of claim 1 wherein said article is a quartz tube.

6. The method of hermetically sealing articles of claim 5 wherein said quartz tube encloses an electrical device.

7. The method of hermetically sealing articles of claim 1 wherein said laser heating is performed by a plurality of beams.

8. The method of hermetically sealing articles of claim 1 further comprising the step of fixing a location of said article so said article remains stationary within said stream of precursor gas.

9. The method of hermetically sealing articles of claim 1 wherein said precursor gas is a hydrocarbon gas.

10. The method of hermetically sealing articles of claim 1 wherein said precursor gas contains silicon.

11. The method of claim 1, wherein said article is an optical fiber and said optical fiber is continuously enters said second curtain at said entry point, exits said first curtain at an exit point, and then passes through said second curtain.

12. A method of coating optical fibers with film comprising the steps of:
    providing a bare optical fiber;
    expelling a stream of precursor gas, at ambient temperature, from a first conduit in a surface of a base thereby creating a first curtain of precursor gas;
    expelling a stream of non-reactive gas, at ambient temperature, from a second conduit in said surface of said base, whereby said stream of non-reactive gas at ambient temperature forms a second curtain of non-reactive gas that peripherally surrounds said first curtain of precursor gas at ambient temperature, said first conduit and second conduit having diameters such that the ratio of the diameter of said second conduit to said first conduit is between 8 and 14;
    moving said fiber relative to said first and second curtains so that said fiber passes through said second curtain, enters said first curtain at an entry point, passes through said first curtain, exits said first curtain at an exit point, and then passes through said second curtain, so that said first curtain at ambient temperature, which is peripherally surrounded by said second curtain at ambient temperature impinges against a segment of said fiber moving therethrough;
    laser heating said segment of said fiber moving through said first curtain, thereby heating and pyrolyzing a portion of said precursor gas in proximity to said segment of said fiber; and
    applying a solid coating formed from said pyrolyzed precursor gas onto said segment of said fiber, so as to form a coated section of said fiber that moves into and through said second curtain, said second curtain contacting and sufficiently cooling said coated section of said fiber cooling to prevent said coating thereon from burning upon exposure to air;
    each of said steps being performed in an open-air environment;
    wherein LCVD induced signal loss of the optical fiber is not observed at the deposition temperature range of 1350-1700 K.

13. The method of coating optical fibers of claim 12 further comprising the step of securing at least one optical fiber in a clamp mountable on a track.

14. The method of coating optical fibers of claim 13 further comprising the step of moving said clamp along said track by use of a rotatable rack and pinion system including a rack and pinion connection, means for rotating said rack and pinion connection, and a path said rack and pinion connection traverses, whereby said optical fiber secured by said clamp passes through said stream of non-reactive gas and into said stream of precursor gas.

15. The method of coating optical fibers of claim 14 further comprising the step of moving said clamp a plurality of discrete distances further along said track with said rack and pinion system, whereby a different segment of said optical fiber is positioned within said stream of precursor gas and said film formed from said pyrolyzed precursor gas is extended over said different segment of said optical fiber.

16. The method of coating optical fibers of claim 15 wherein said clamp is a moving clamp and continuously moves along said track to apply said film to entire length of said optical fiber.

17. The method of coating optical fibers of claim 12 further comprising the step of drawing said stream of non-reactive gas, said stream of precursor gas, said pyrolyzed precursor gas not bonded to said optical fiber into an exhaust hood opposite said surface of said base.

18. The method of coating optical fibers of claim 12 further comprising the step of cleansing said optical fibers with a substance selected from the group consisting of methanol, distilled water, and mixture thereof.

19. The method of coating optical fibers of claim 12 further comprising the step of expelling supplementary streams of precursor gas from at least one additional conduit in said surface of said base, wherein said second conduit surrounds said additional conduit, whereby said stream of non-reactive gas peripherally surrounds said supplementary streams of precursor gas.

20. The method of coating optical fibers of claim 12 wherein said step of applying occurs at atmospheric pressure.

21. The method of coating optical fibers of claim 12 wherein said optical fiber includes a first segment and a second segment spliced together at a spliced joint and said segment of said optical fiber to be coated is located within said stream of precursor gas includes said spliced joint.

22. A method of coating, optical fibers with a carbon layer comprising the step of:
    providing at least one optical fiber;
    cleansing said optical fiber with a substance selected from the group consisting of methanol, distilled water, and mixtures thereof;
    securing said optical fiber in a clamp mountable on a track;
    expelling a stream of precursor gas, at ambient temperature, from a first conduit in a surface of a base;
    expelling a stream of non-reactive gas, at ambient temperature, from a second conduit in said surface of said base, whereby said stream of non-reactive gas at ambient temperature peripherally surrounds said stream of precursor gas at ambient temperature, said first conduit and second conduit having diameters such that the ratio of the diameter of said second conduit to said first conduit is between 8 and 14;
    moving said clamp along said track by use of a rotatable rack and pinion system including a rack and pinion link, means for rotating said rack and pinion link, and a path having a plurality of ball bearings traversable by said rack and pinion link, whereby said optical fiber secured by said clamp passes through said stream of non-reactive gas and into said stream of precursor gas at an entry point, passes through said stream of precursor gas then exits said stream of precursor gas at an exit point and then passes through and exits said stream of non-reactive gas;
    directing said stream of precursor gas at ambient temperature, which is peripherally surrounded by said stream of non-reactive gas at ambient temperature, toward and onto a segment of said article while said stream of precursor gas and said stream of non-reactive gas are maintained at ambient temperature so that said stream of precursor gas impinges against said segment of said article;
    laser heating said segment of said optical fiber located moving through said stream of precursor gas with beams from at least one laser, thereby heating and pyrolyzing some of said precursor gas in proximity to said segment of said optical fiber;
    applying a solid layer formed from said pyrolyzed precursor gas onto said segment of said optical fiber, so as to form a coated section of said optical fiber;
    moving said clamp further along said track with said rack and pillion system, whereby a next uncoated portion of said optical fiber is in said stream of precursor gas and may be coated with said solid layer formed from said pyrolyzed precursor gas and the coated section of said article that moves into and through said stream of non-reactive gas, said stream of non-reactive gas contacting and sufficiently cooling said coated section of said article cooling to prevent said coating thereon from burning upon exposure to air; and
    drawing said stream of non-reactive gas, said stream of precursor gas, and products of pyrolization of said precursor gas unbonded to said optical fiber into an exhaust hood oriented parallel to said surface of said base;
    each of said steps being performed in an open-air environment.

23. A method of hermetically sealing articles by applying a coating comprising the steps of:
    providing an article to be hermetically sealed with a coating, said article including a microchip sandwiched between at least two silicon wafers;
    expelling a stream of precursor gas from a first conduit in a surface of a base;
    expelling a stream of non-reactive as from a second conduit in said surface of said base, whereby said stream of non-reactive gas peripherally encloses said stream of precursor gas;
    heating a segment of said article located within said stream of said precursor gas, thereby heating and pyrolyzing a portion of said precursor gas in proximity to said segment of said article; and
    applying a solid coating formed from said pyrolyzed precursor gas onto said segment of said article.

24. A method of hermetically sealing articles by applying a coating comprising the steps of:
    providing an article to be hermetically sealed with a coating, said article being a quartz tube that encloses an electrical device;
    expelling a stream of precursor gas from a first conduit in a surface of a base;
    expelling a stream of non-reactive gas from a second conduit in said surface of said base, whereby said stream of non-reactive gas peripherally encloses said stream of precursor gas;
    heating a segment of said article located within said stream of said precursor gas, thereby heating and pyrolyzing a portion of said precursor gas in proximity to said segment of said article; and
    applying a solid coating formed from said pyrolyzed precursor gas onto said segment of said article.

* * * * *